(12) United States Patent
Wang et al.

(10) Patent No.: US 12,205,816 B2
(45) Date of Patent: Jan. 21, 2025

(54) INTERCONNECT STRUCTURE FOR SEMICONDUCTOR DEVICES

(71) Applicant: Taiwan Semiconductor Manufacturing Co., Ltd., Hsinchu (TW)

(72) Inventors: Po-Chuan Wang, Taipei (TW); Guan-Xuan Chen, Taoyuan (TW); Chia-Yang Hung, Kaohsiung (TW); Sheng-Liang Pan, Hsinchu (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 279 days.

(21) Appl. No.: 17/232,465

(22) Filed: Apr. 16, 2021

(65) Prior Publication Data
US 2022/0102138 A1 Mar. 31, 2022

Related U.S. Application Data

(60) Provisional application No. 63/085,217, filed on Sep. 30, 2020.

(51) Int. Cl.
*H01L 21/02* (2006.01)
*H01L 21/311* (2006.01)
*H01L 21/768* (2006.01)

(52) U.S. Cl.
CPC .. *H01L 21/02063* (2013.01); *H01L 21/31116* (2013.01); *H01L 21/31144* (2013.01); *H01L 21/76814* (2013.01); *H01L 21/76883* (2013.01)

(58) Field of Classification Search
CPC ......... H01L 21/02063; H01L 21/31116; H01L 21/31144; H01L 21/76814; H01L 21/76883; H01L 23/485; H01L 21/31138; H01L 21/32134; H01L 23/5226; H01L 21/76805; H01L 21/76877
See application file for complete search history.

(56) References Cited

U.S. PATENT DOCUMENTS 6,683,002 B1 * 1/2004 Chooi ............... H01L 21/28556
438/666
7,344,993 B2 3/2008 Balasubramaniam et al.
(Continued)

FOREIGN PATENT DOCUMENTS

JP 2008527711 A 7/2008
KR 100542031 B1 1/2006
(Continued)

*Primary Examiner* — Jay C Kim
*Assistant Examiner* — Woo K Lee
(74) *Attorney, Agent, or Firm* — Slater Matsil, LLP (57) ABSTRACT

A method of forming a semiconductor device includes: forming a first conductive feature in a first dielectric layer disposed over a substrate; forming a second dielectric layer over the first dielectric layer; etching the second dielectric layer using a patterned mask layer to form an opening in the second dielectric layer, where the opening exposes the first conductive feature; performing an ashing process to remove the patterned mask layer after the etching; wet cleaning the opening after the ashing process, where the wet cleaning enlarges a bottom portion of the opening; and filling the opening with a first electrically conductive material.

20 Claims, 10 Drawing Sheets

(56) References Cited

U.S. PATENT DOCUMENTS

| | | | |
|---|---|---|---|
| 7,807,579 B2 | 10/2010 | Yang et al. | |
| 9,559,190 B2 | 1/2017 | Chen et al. | |
| 10,720,385 B2 | 7/2020 | Chen et al. | |
| 11,004,794 B2 | 5/2021 | Tsai et al. | |
| 11,075,112 B2* | 7/2021 | Chang | H01L 23/5329 |
| 11,088,025 B2* | 8/2021 | Hsieh | H01L 21/76886 |
| 11,600,521 B2 | 3/2023 | Lian et al. | |
| 2003/0032300 A1 | 2/2003 | Waldfried et al. | |
| 2005/0034744 A1* | 2/2005 | Sohn | G03F 7/425 |
| | | | 257/E21.228 |
| 2008/0079090 A1 | 4/2008 | Hwang et al. | |
| 2012/0043592 A1 | 2/2012 | Zhao et al. | |
| 2019/0287851 A1 | 9/2019 | Chen et al. | |
| 2020/0105586 A1 | 4/2020 | Hsu et al. | |
| 2021/0090899 A1* | 3/2021 | Liao | H01L 21/76885 |

FOREIGN PATENT DOCUMENTS

| | | |
|---|---|---|
| KR | 100791345 B1 | 1/2008 |
| KR | 20150093583 A | 8/2015 |
| KR | 20180044866 A | 5/2018 |
| KR | 20180131346 A | 12/2018 |
| KR | 20200001544 A | 1/2020 |
| KR | 20200037047 A | 4/2020 |

* cited by examiner

INTERCONNECT STRUCTURE FOR SEMICONDUCTOR DEVICES

PRIORITY CLAIM AND CROSS-REFERENCE

This application claims the benefit of the U.S. Provisional Application No. 63/085,217, filed Sep. 30, 2020 and entitled "Novel H2/Ar Plasma Treatment to Enlarge Co Recess Profile Beyond 3 nm Node," which application is hereby incorporated herein by reference.

BACKGROUND

High-density integrated circuits, such as Very Large Scale Integration (VLSI) circuits, are typically formed with multiple metal interconnects to serve as three-dimensional wiring line structures. The purpose of the multiple interconnects is to properly link densely packed devices together. With increasing levels of integration, a parasitic capacitance effect between the metal interconnects, which leads to RC delay and cross-talk, increases correspondingly. In order to reduce the parasitic capacitance and increase the conduction speed between the metal interconnections, low-k dielectric materials are commonly employed to form Inter-Layer Dielectric (ILD) layers and Inter-Metal Dielectric (IMD) layers.

Metal lines and vias are formed in the IMD layers. A formation process may include forming an etch stop layer over first conductive features, and forming a low-k dielectric layer over the etch stop layer. The low-k dielectric layer and the etch stop layer are patterned to form a trench and a via opening. The trench and the via opening are then filled with a conductive material, followed by a planarization process to remove excess conductive material, so that a metal line and a via are formed.

As feature sizes continue to shrink in advanced semiconductor manufacturing process, new challenges arise for semiconductor manufacturing. There is a need in the art for structures and methods for interconnect structures that are suitable for advanced semiconductor manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

An interconnect structure of a semiconductor device and the method of forming the same are provided in accordance with some embodiments. In some embodiments, an anisotropic plasma etching process is performed to form an opening in a second dielectric layer, where the opening exposes a conductive feature in a first dielectric layer underlying the second dielectric layer. After the opening is formed, the conductive feature is treated with a plasma process, wherein the plasma process converts an upper portion of the conductive feature into a first material. After the plasma process, a multi-step wet cleaning process is performed using deionized water (DIW) to clean the opening. The DIW dissolves and remove the first material, thereby enlarging a bottom portion of the opening. A conductive material is then formed to fill the opening to form a via. The enlarged bottom portion of the via formed may catch CMP slurry seeping down through cracks between the via and the second dielectric layer, and may reduce recessing of the upper surface of the conductive feature due to etching of the conductive feature by the slurry.

FIGS. 1-3, 4A, 4B, and 5-8 illustrate cross-sectional views of a semiconductor device 100 at various stages of manufacturing, in accordance with an embodiment. The semiconductor device 100 may be a device wafer including active devices (e.g., transistors, diodes, or the like) and/or passive devices (e.g., capacitors, inductors, resistors, or the like). In some embodiments, the semiconductor device 100 is an interposer wafer, which may or may not include active devices and/or passive devices. In accordance with yet another embodiment of the present disclosure, the semiconductor device 100 is a package substrate strip, which may be package substrates with cores therein or may be core-less package substrates. In subsequent discussion, a device wafer is used as an example of the semiconductor device 100. The teaching of the present disclosure may also be applied to interposer wafers, package substrates, or other semiconductor structures, as skilled artisans readily appreciate.

Figure 1:
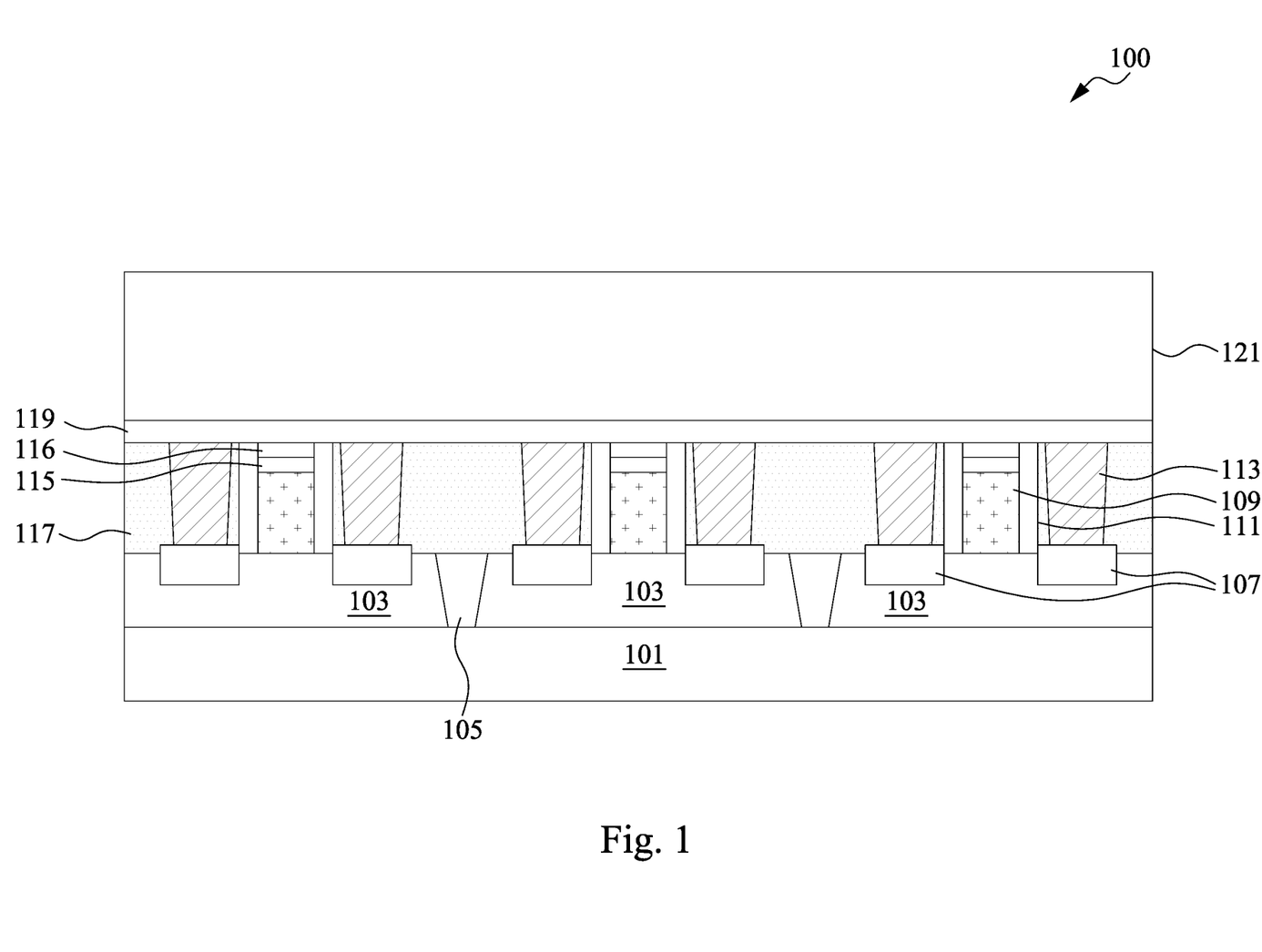
FIGS. 1-3, 4A, 4B, and 5-8 illustrate cross-sectional views of a semiconductor device at various stages of manufacturing, in accordance with an embodiment.

As illustrated in FIG. 1, the semiconductor device 100 includes a semiconductor substrate 101 (also referred to as a substrate). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components, such as transistors, resistors, capacitors, inductors, diodes, or the like, are formed in or on the substrate 101, e.g., in the front-end-of-line (FEOL) processing of semiconductor manufacturing. In the example of FIG. 1, semiconductor fins 103 (also referred to as fins) are formed protruding above the substrate 101. Isolation regions 105, such as shallow-trench isolation (STI) regions, are formed between or around the semiconductor fins 103. Gate structures 109 are formed over the semiconductor fins 103. Each of the gate structures 109 may be, e.g., a metal gate structure that includes a gate electrode, work function layer(s) around the gate electrode, and a gate dielectric layer around the work function layer(s). Details of the gate structures 109 are known to one skilled in the art, thus not repeated here. Gate spacers 111 are formed along sidewalls of the gate structures 109. In the example of FIG. 1, a cap layer 115 (e.g., a layer of tungsten) is formed over the gate structure 109, and a mask layer 116 (e.g., titanium nitride) is formed over the cap layer 115. Source/drain regions 107, such as epitaxial source/drain regions, are formed on opposing sides of the gate structure 109.

After the electrical components (e.g., FinFETs) are formed, an Inter-Layer Dielectric (ILD) layer 117 is formed over the semiconductor substrate 101 and around the gate structures 109. The ILD layer 117 may fill spaces between the gate structures 109. In accordance with some embodiments, the ILD layer 117 comprises silicon oxide, phosphosilicate glass (PSG), borosilicate glass (BSG), boron-doped phosphosilicate glass (BPSG), fluorine-doped silicate glass (FSG), or the like. The ILD layer 117 may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Still referring to FIG. 1, contact plugs 113, such as source/drain contacts, are formed in the ILD layer 117, which contact plugs 113 electrically couple the source/drain regions 107 to subsequently formed conductive features such as metal lines, vias, and conductive pillars over the source/drain regions 107. Note that in the present disclosure, unless otherwise specified, a conductive feature refers to an electrically conductive feature, and a conductive material refers to an electrical conductive material. In an example embodiment, the contact plugs 113 are formed of a conductive material such as cobalt, although other suitable conductive materials, such as tungsten, aluminum, copper, titanium, tantalum, titanium nitride, tantalum nitride, alloys thereof, and/or multi-layers thereof, may also be used. The formation of the contact plugs 113 may include forming contact openings in the ILD layer 117 to expose the source/drain region 107, forming one or more conductive material(s) in the contact openings, and performing a planarization process, such as a Chemical Mechanical Polish (CMP), to level the top surface of the contact plugs 113 with the top surface of the ILD layer 117. Similar processing may be performed to form gate contacts (not illustrated) over and electrically coupled to the gate structures 109. In some embodiments, the gate contacts are formed by forming openings that extend through the mask layer 116 and the cap layer 115 to expose the gate electrode of the gate structure 109, then filling the openings with a conductive material, such as tungsten. The gate contacts may not be in the same cross-section with the source/drain contacts 113, thus not illustrated in FIG. 1.

Next, an etch stop layer (ESL) 119 is formed over the ILD layer 117. In some embodiments, the ESL 119 comprises silicon nitride formed by PECVD, although other dielectric materials such as nitride, carbide, combinations thereof, or the like, and alternative techniques of forming the ESL 119, such as LPCVD, PVD, or the like, could alternatively be used. In some embodiments, the ESL 119 is omitted.

Next, an Inter-Metal Dielectric (IMD) layer 121 is formed over the ESL 119 (if formed) and over the ILD layer 117. The IMD layer 121 may be formed of a dielectric material such as silicon oxide, silicon nitride, silicon carbide, silicon oxynitride, or the like. In accordance with some embodiments, the IMD layers 121 is formed of a low-k dielectric material having a dielectric constant (k-value) lower than 3.0, such as about 2.5, about 2.0, or even lower. The IMD layers 121 may comprise a carbon-containing low-k dielectric material, Hydrogen SilsesQuioxane (HSQ), MethylSilsesQuioxane (MSQ), or the like. The formation of the IMD layer 121 may include depositing a porogen-containing dielectric material over the ILD layer 117, and then performing a curing process to drive out the porogen, thereby forming the IMD layer 121 that is porous, as an example. Other suitable method may also be used to form the IMD layer 121.

Figure 2:
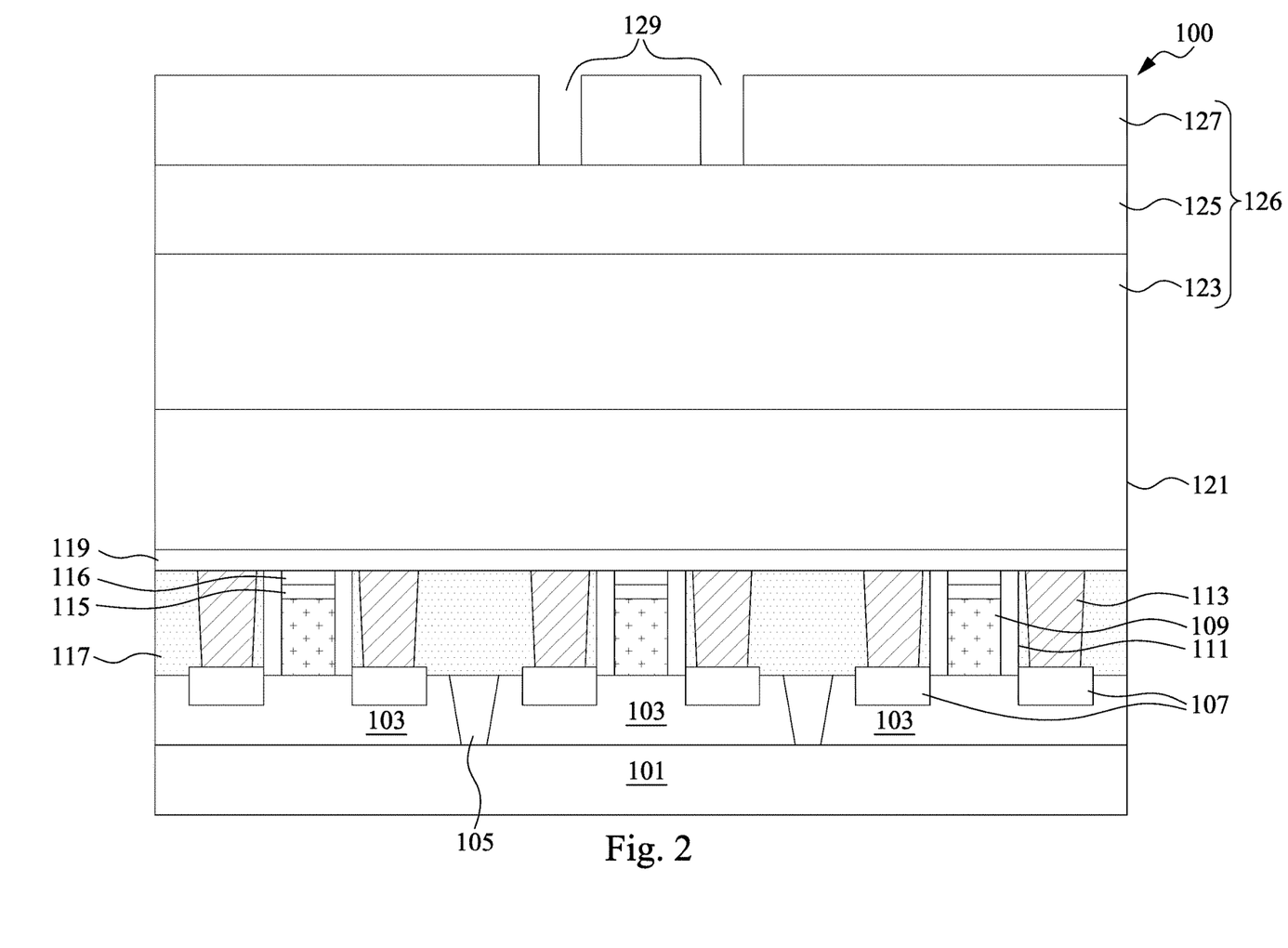

Next, in FIG. 2, a tri-layered photoresist 126 comprising a top photoresist layer 127, a middle layer 125, and a bottom anti-reflective coating (BARC) layer 123, is formed over the IMD layer 121. The BARC layer 123 of the tri-layered photoresist 126 may comprise an organic or inorganic material. The middle layer 125 may comprise silicon nitride, silicon oxynitride, or the like, that has an etch selectivity to the top photoresist layer 127, such that the top photoresist layer 127 can be used as a mask layer to pattern the middle layer 125. The top photoresist layer 127 may comprise a photosensitive material. Any suitable deposition method, such as PVD, CVD, spin coating, the like, or combinations thereof, may be used to form the tri-layered photoresist 126.

Once the tri-layered photoresist 126 is formed, patterns 129 (e.g., openings) are formed in the top photoresist layer 127. In an embodiment, the top photoresist layer 127 is patterned by exposing the photosensitive material within the top photoresist layer 127 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist layer 127 are different from the physical properties of the unexposed portions of the top photoresist layer 127. The top photoresist layer 127 may then be developed with a developer to remove the exposed portion of the top photoresist layer 127 or the unexposed portion of the top photoresist layer 127, depending on, e.g., whether a negative photosensitive material or a positive photosensitive material is used for the top photoresist layer 127. The remaining portions of the top photoresist layer 127 form a patterned photoresist layer. Next, the patterns 129 in the top photoresist layer 127 are extended through the middle layer 125 and the BARC layer 123, and are transferred to the IMD layer 121 using a suitable method, such as one or more anisotropic etching processes.

Figure 3:
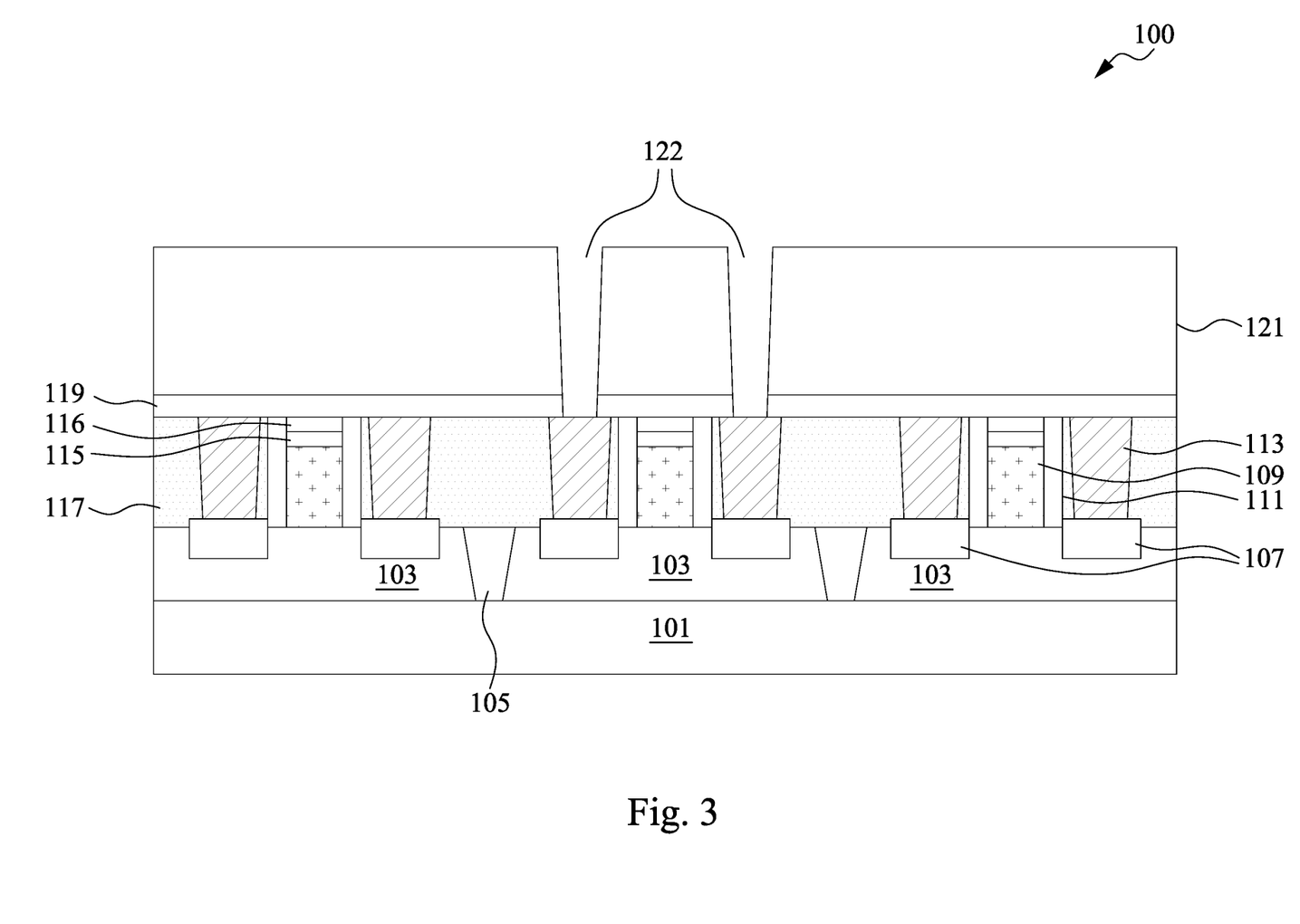

FIG. 3 illustrates the cross-sectional view of the semiconductor device 100 after the patterns of the top photoresist layer 127 are transferred to the IMD layer 121. In some embodiments, to transfer the patterns of the top photoresist layer 127, an anisotropic etching processes, such as an anisotropic plasma etching process, is performed. The anisotropic plasma etching process is a reactive-ion etching (RIE) process performed using, e.g., a fluoride-containing etching gas, such as an etching gas comprising carbon hydrogen fluoride ($C_xH_yF_z$ such as $CHF_3$), in some embodiments. As illustrated in FIG. 3, after the anisotropic plasma etching process, openings 122 (may also be referred to as via openings) are formed in the IMD layer 121 and extend through the ESL 119 (if formed), which openings 122 expose upper surfaces of the underlying contact plugs 113. The bottoms of the openings 122 in the example of FIG. 3 are level with the upper surface of the ILD layer 117. FIG. 3 illustrates two openings 122 as a non-limiting example. Other openings may be formed to expose the upper surfaces of other contact plugs 113, as skilled artisans readily appreciate. In some embodiments, the fluoride (F) in the etching gas may be implanted into the contact plugs 113 during the anisotropic plasma etching process, and may be referred to as fluoride impurities in the contact plugs 113.

After the anisotropic plasma etching process, the tri-layered photoresist 126 is removed. In some embodiments, an ashing process (a plasma process) is performed to remove the tri-layered photoresist 126. The ashing process may be performed using a gas source comprising a mixture of hydrogen gas ($H_2$) and a suitable inert gas, such as argon (Ar) or helium (He). In other words, the gas source used for the ashing process may be a mixture of $H_2$ and Ar, or a mixture of $H_2$ and He.

In an example embodiment, the ashing process is performed using a gas source comprising a mixture of $H_2$ and Ar. In some embodiments, the gas source (e.g., $H_2$ and Ar) is ignited into plasma for the ashing process. During the ashing process, $H^+$ radicals generated from the gas source enter the contact plugs 113, collide with the fluoride impurities inside the contact plugs 113 (that were generated by the plasma etching process discussed above to generate the openings 122), and drive the fluoride impurities to the upper surfaces of the contact plugs 113. The fluoride impurities driven to the upper surfaces of the contact plugs 113 react with the material (e.g., cobalt) of the contact plugs 113 to form, e.g., cobalt fluoride ($Co_xF_y$, such as $CoF_2$, $CoF_3$), in the illustrated embodiment. In other words, in the illustrated embodiment, the upper portions of the contact plugs 113 (e.g. portions proximate to the upper surfaces of the contact plugs 113) are converted into cobalt fluoride. Notably, in the illustrated embodiment, the gas source for the ashing process is free of nitrogen. This is because a gas source comprising nitrogen may convert the upper portions of the contact plugs 113 into cobalt nitride in the ashing process, and cobalt nitride could not be removed by the subsequent wet cleaning process to form enlarged bottom portions for the openings 122.

In some embodiments, a mixing ratio R (e.g., volume ratio, or a flow rate ratio) between the inert gas (e.g., Ar) and $H_2$ in the gas source of the ashing process is equal to or smaller than 2 (e.g., R≤2). If the mixing ratio R is larger than 2, the $H^+$ radicals may be diluted too much, and may not be able to sufficiently collide with the fluoride impurities and drive the impurities up to the upper surfaces of the contact plugs 113. As will be discussed hereinafter with reference to FIG. 4A, the cobalt fluoride, which is formed by reaction between the fluoride impurities and cobalt at the upper surfaces of the contact plugs 113, will be removed by a subsequent wet cleaning process to form recesses in the upper surfaces of the contact plugs 113, thereby forming enlarged bottom portions for the openings 122. Therefore, a mixing ratio R larger than 2 will negatively affect the efficiency of the $H^+$ radical treatment of the contact plugs 113, and may prevent the recesses from being formed at the upper surfaces of the contact plugs 113.

In some embodiments, the process conditions of the ashing process is tuned (e.g., adjusted) in accordance with the concentration of the fluoride in the contact plugs, in order to ensure sufficient treatment of the contact plugs 113 by the ashing process. For example, the RF power (e.g., for igniting the gas source into plasma) of the ashing process and/or the process time of the ashing process may be increased for high concentration (e.g., larger than 15 atomic percentage) of fluoride in the contact plugs 113. In addition, or alternatively, the pressure of the ashing process may be decreased for high concentration (e.g., larger than 15 atomic percentage) of fluoride in the contact plugs 113. The increase plasma power, the increased process time, and/or the decreased pressure help to enhance the probability of the $H^+$ radicals colliding with the fluoride impurities. To determine the concentration of fluoride in the contact plug 113, a test wafer may be processed by the same anisotropic plasma etching process discussed above, then an X-ray Photoelectron Spectroscopy (XPS) measurement is performed to determine the concentration of the fluoride, as an example.

Figure 4A:
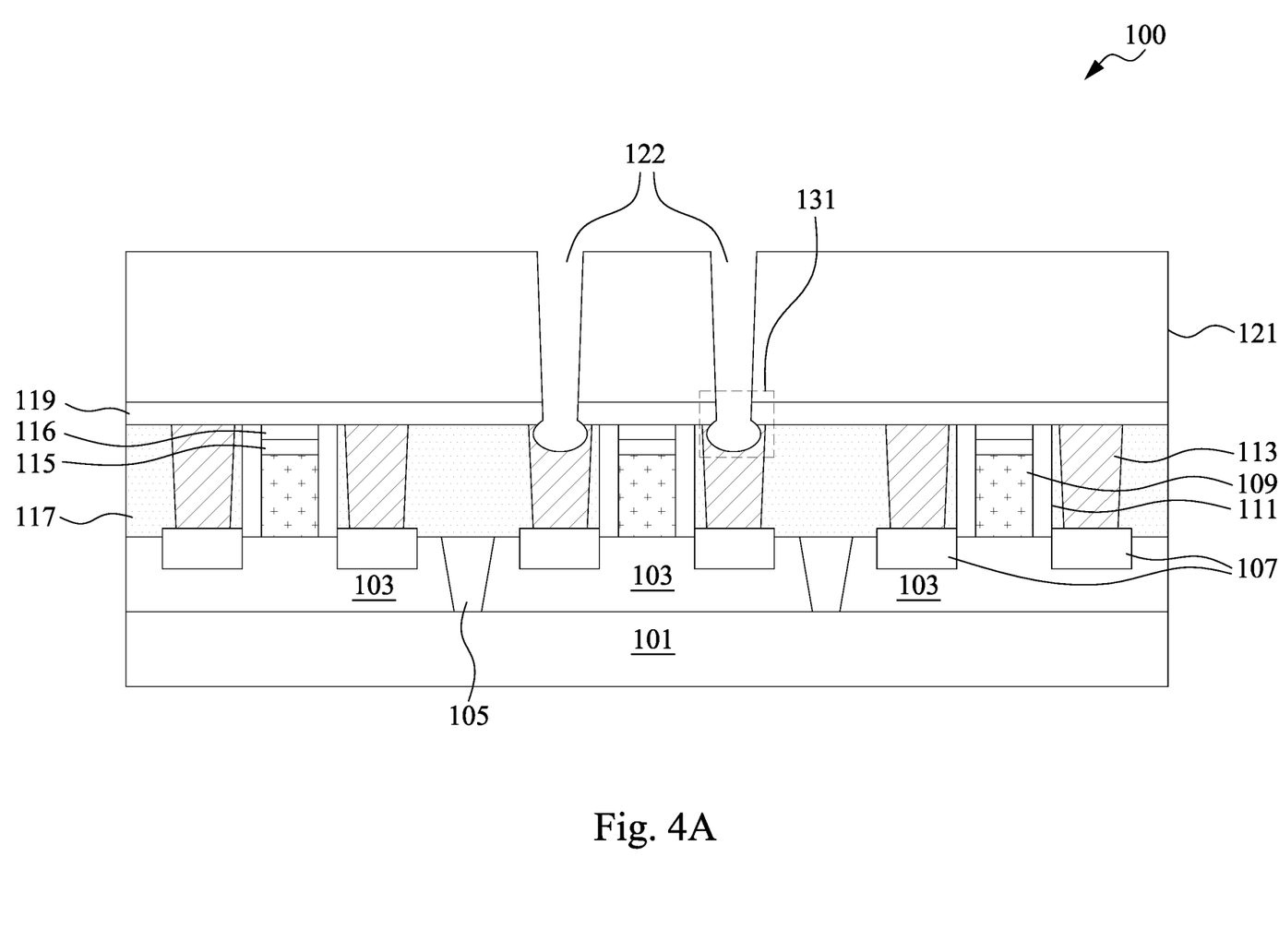

Next, in FIG. 4A, a wet cleaning process is performed to clean the openings 122. In some embodiments, the wet cleaning process is performed in three successive steps. The first cleaning step is performed using deionized water (DIW), and may also be referred to as a DIW cleaning step. The DIW cleaning step may be performed for, e.g., about 50 seconds. Recall that the ashing process converts upper portions of the contact plugs 113 into cobalt fluoride. In some embodiments, the upper portions of the contact plugs 113, which is cobalt fluoride, dissolve in the DIW and are removed by the DIW cleaning step. Next, the second cleaning step is performed using an acid, such as 4-Methyl-2-(phenylamino)-1,3-thiazole-5-carboxylic acid (may also be referred to as MS9600 acid). The second cleaning step may also be referred to as an acid cleaning step. The acid cleaning step may be performed for, e.g., 120 seconds. Next, the third cleaning step is performed using isopropyl alcohol (IPA), and therefore, may also be referred to as an IPA cleaning step. The IPA cleaning step may be performed for, e.g., about 10 seconds to about 100 seconds. Note that the cleaning fluid and the by-products (if any) of each cleaning step are removed after each cleaning step is finished and before the next processing step (e.g., the next cleaning step) is performed, in some embodiments.

As discussed above, the wet cleaning process removes the upper portions of the contact plugs 113, thereby enlarging the bottom portions of the openings 122. As illustrated in FIG. 4A, the wet cleaning process recesses the upper surfaces of the contact plugs 113, e.g., below the upper surface of the ILD layer 117. As a result, the enlarged bottom portions of the openings 122 extend into the contact plugs 113, and form undercuts under the IMD layer 121. In other words, the enlarged bottom portion of each of the openings 122 is wider than the opening 122, and therefore, extends laterally beyond sidewalls of the IMD layer 121 exposed by the opening 122. The enlarged bottom portion of each opening 122 in FIG. 4A has curve sidewalls, and resembles portions of an oval shape. Besides the illustrated shape, other shapes for the cross-section of the enlarged bottom portion of the opening 122 are also possible, and are fully intended to be included within the scope of the present disclosure.

In some embodiments, after the wet cleaning process, a plasma process is performed to remove by-products (e.g., carbon-containing by-products) left by the wet cleaning process and/or the previous etching processes. The plasma process may be performed using a gas source comprising oxygen ($O_2$). The oxygen gas is ignited into plasma, and the plasma is supplied to the opening 122 to remove, e.g., the carbon-containing by-products. A temperature of the plasma process may be, e.g., 160° C.

Figure 4B:
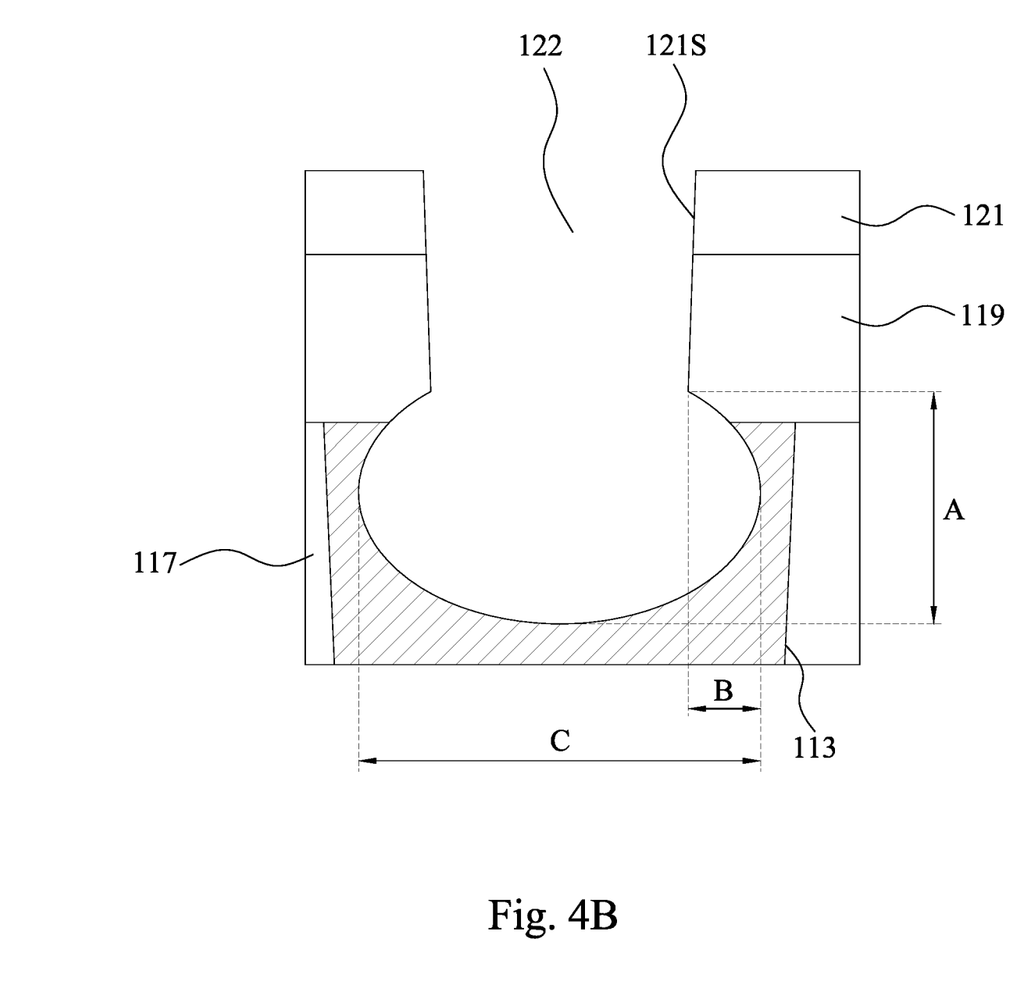

FIG. 4B illustrates a zoomed-in view of an area 131 in FIG. 4A. As illustrated in FIG. 4B, the enlarged bottom portion of the opening 122 has a width C measured between, e.g., opposing sidewalls at a widest portion of the enlarged bottom portion, and a depth A between the upper surface of the ILD layer 117 and a bottom of the opening 122. In addition, an undercut portion of the opening 122 has a width B. In other words, the undercut portion of the opening 122 extends beyond the sidewall 121S of the IMD layer 121 by a distance of B. In some embodiments, a ratio between A and C is between 0.28 and 0.32 (e.g., $0.28 \leq A/C \leq 0.32$). In some embodiments, a ratio between A and B is between 0.9 and 1.1 (e.g., $0.9 \leq A/B \leq 1.1$). In some embodiments, a ratio between B and C is between 0.28 and 0.31 (e.g., $0.28 \leq B/C \leq 0.31$). In some embodiments, a difference between A and B is less than 1 nm (e.g., A−B<1 nm).

Figure 5:
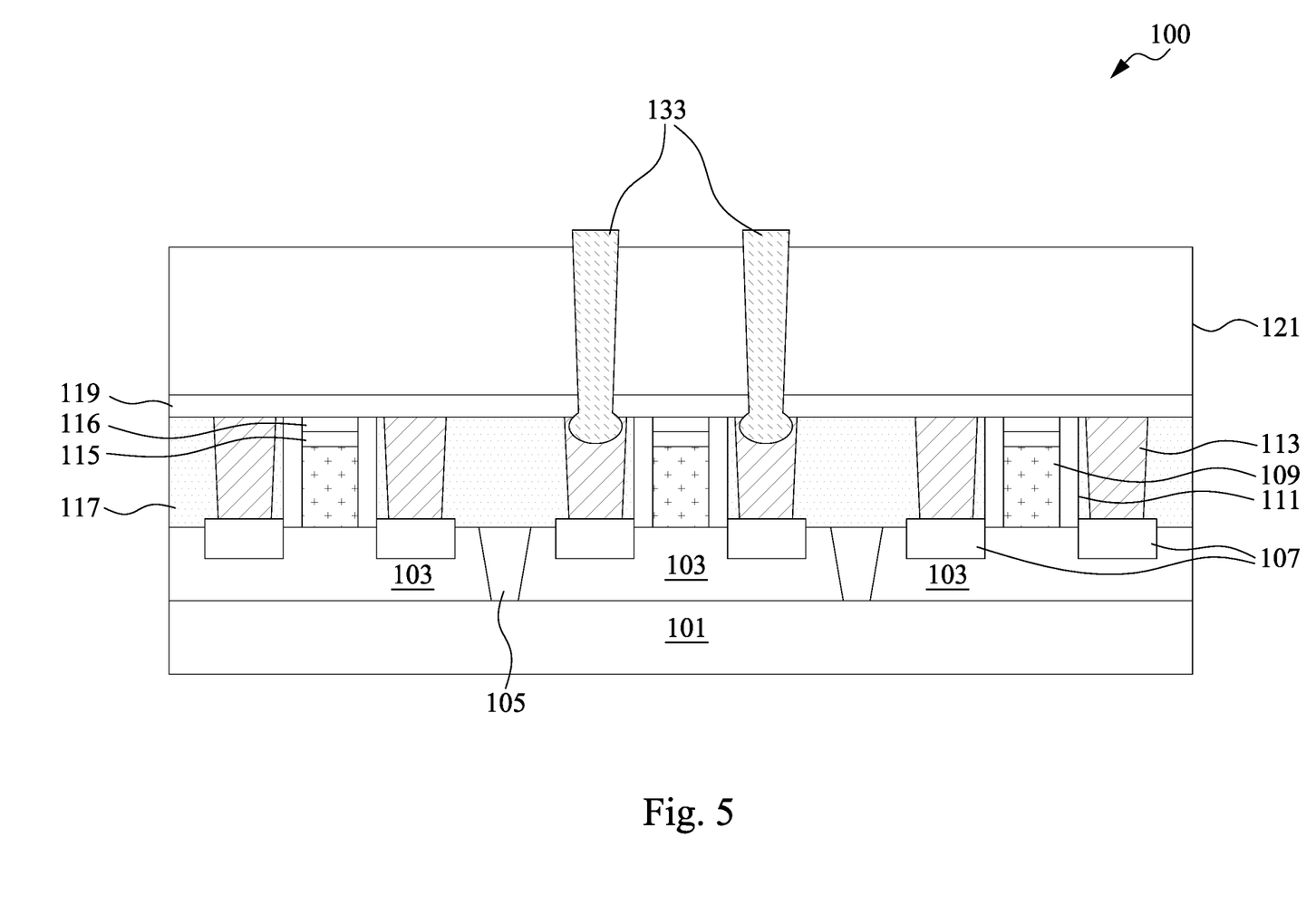

Next, in FIG. 5, a conductive material 133, such as tungsten, is formed in the openings 122 to fill the openings 122. The conductive material 133 may overfill the openings 122 and extend above the upper surface of the IMD layer 121. In some embodiments, the conductive material 133 is formed selectively over the contact plugs 113 using a suitable formation method (e.g., a slow ALD (SALD) process), such that the conductive material 133 is formed in a bottom-up fashion, thereby filling the openings 122 better (e.g., with less or no voids) than, e.g., a bulk formation method, such as CVD or PVD. As illustrated in FIG. 5, the conductive material 133 fills the undercut portions of the enlarged bottom portions of the opening 122, and therefore, forms vias 133 with enlarged bottom portions. The enlarged bottom portion of each of the vias 133 is wider than an overlying portion (e.g., a portion between opposing sidewalls of the IMD layer 121 proximate to the lower surface of the IMD layer 121) of the vias 133. In some embodiments, the enlarged bottom portion of each via 133 extends laterally beyond opposing sidewalls of the IMD layer 121 facing the via 133.

Figure 6:
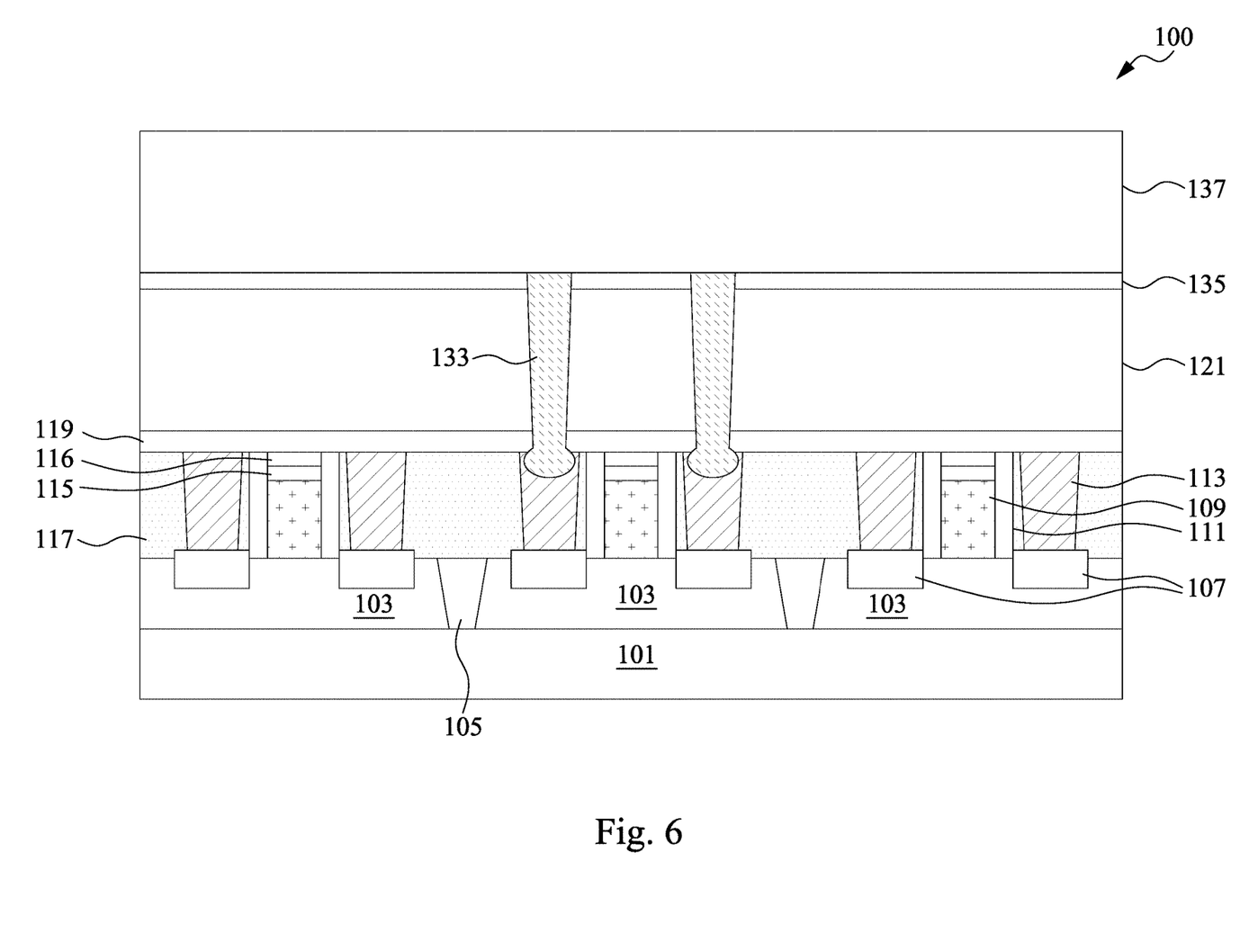

Next, in FIG. 6, a barrier layer 135 is formed over the upper surface of the IMD layer 121. The barrier layer 135 may comprise titanium, titanium nitride, or the like, formed by a suitable formation method such as PVD, CVD, ALD, or the like. Next, a conductive material 137 is formed over the barrier layer 135. In the illustrated embodiment, the conductive material 137 is the same material (e.g., tungsten) as the conductive material 133, but formed of a different formation method. For example, instead of the selective, bottom-up formation method for the conductive material 133, the conductive material 137 is formed of a bulk formation method such as CVD, PVD, or sputtering. The bulk formation method may be used to reduce the process time for forming the conductive material 137.

Figure 7:
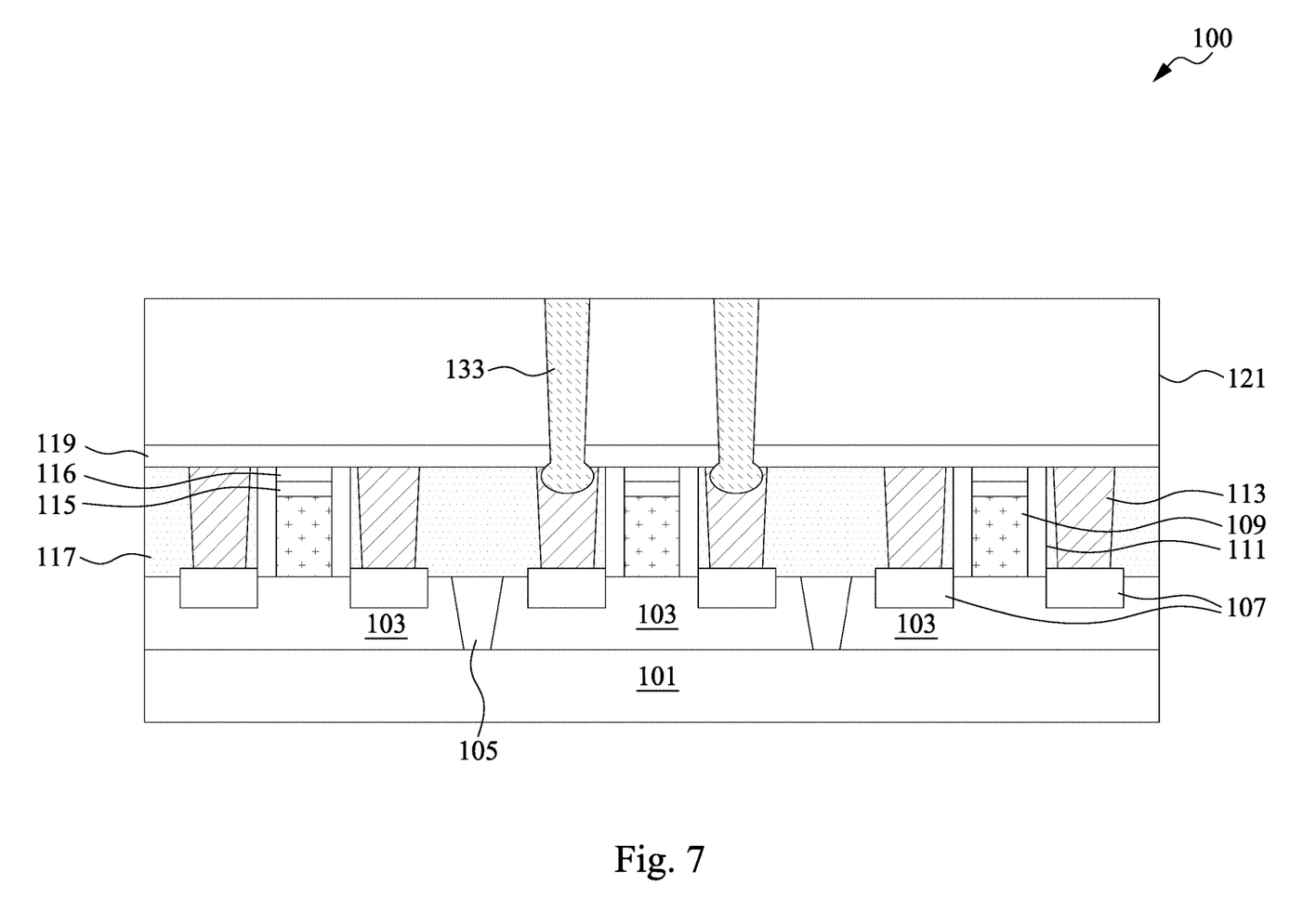

Next, in FIG. 7, a planarization process, such as CMP, is performed to remove the conductive material 137 and the barrier layer 135 from the upper surface of the IMD layer 121, and to achieve a coplanar upper surface between the IMD layer 121 and the vias 133. In some embodiments, the interface between the conductive material 137 and the barrier layer 135 serves as an etch-stop mark for the CMP process, such that the CMP process can be stopped after the upper surface of the IMD layer 121 is exposed.

As feature size continues to shrink in advanced processing nodes, it becomes increasingly difficult to form vias 133 due to the high aspect ratio of the via openings. In order to make it easier to fill the via openings, the vias 133 may be formed without a barrier layer or an adhesion layer. Therefore, adhesion between the vias 133 and their surrounding layers (e.g., the IMD layer 121 and the ESL 119) may degrade, and tiny cracks may exist between, e.g., the vias 133 and the IMD layer 121/ESL 119. During the CMP process, the slurry used in the CMP process (may also be referred to as CMP slurry) may seep down through the cracks and reach the contact plugs 113. The slurry may have a high etch selectivity (e.g., having a high etch rate) for the material (e.g., cobalt) of the contact plugs 113, and therefore, may cause the upper surfaces of the contact plugs 113 to recess, thereby causing unreliable electrical connection between the vias 133 and the underlying contact plugs 113. The disclosed method, by enlarging the bottom portion of the via openings, allows vias 133 with enlarged bottom portions to be formed. The enlarged bottom portions of the vias 133 form a better seal around the cracks, e.g., at the bottom surface of the ESL 119 to reduce the amount of CMP slurry that can seep through the ESL 119. In addition, the enlarged bottom portions of the vias 133 may also catch a small amount of CMP slurry that does seep through the ESL 119. Therefore, during the CMP process, the CMP slurry may seep down through the cracks (e.g., along the sidewalls of the vias 133) between the vias 133 and the IMD layer 121, but most of the CMP slurry is either stopped in the ESL 119 by the enlarged bottom portions of the vias 133, or is caught by the enlarged bottom portion of the vias 133. As a result, the amount of CMP slurry reaching the contact plug 113 is reduced or eliminated, thereby reducing or preventing recessing of the contact plugs 113. Another advantage is reduced electrical resistance for the vias 133, due to the enlarged bottom portions, which may also reduce the RC delay of the semiconductor device formed.

Figure 8:
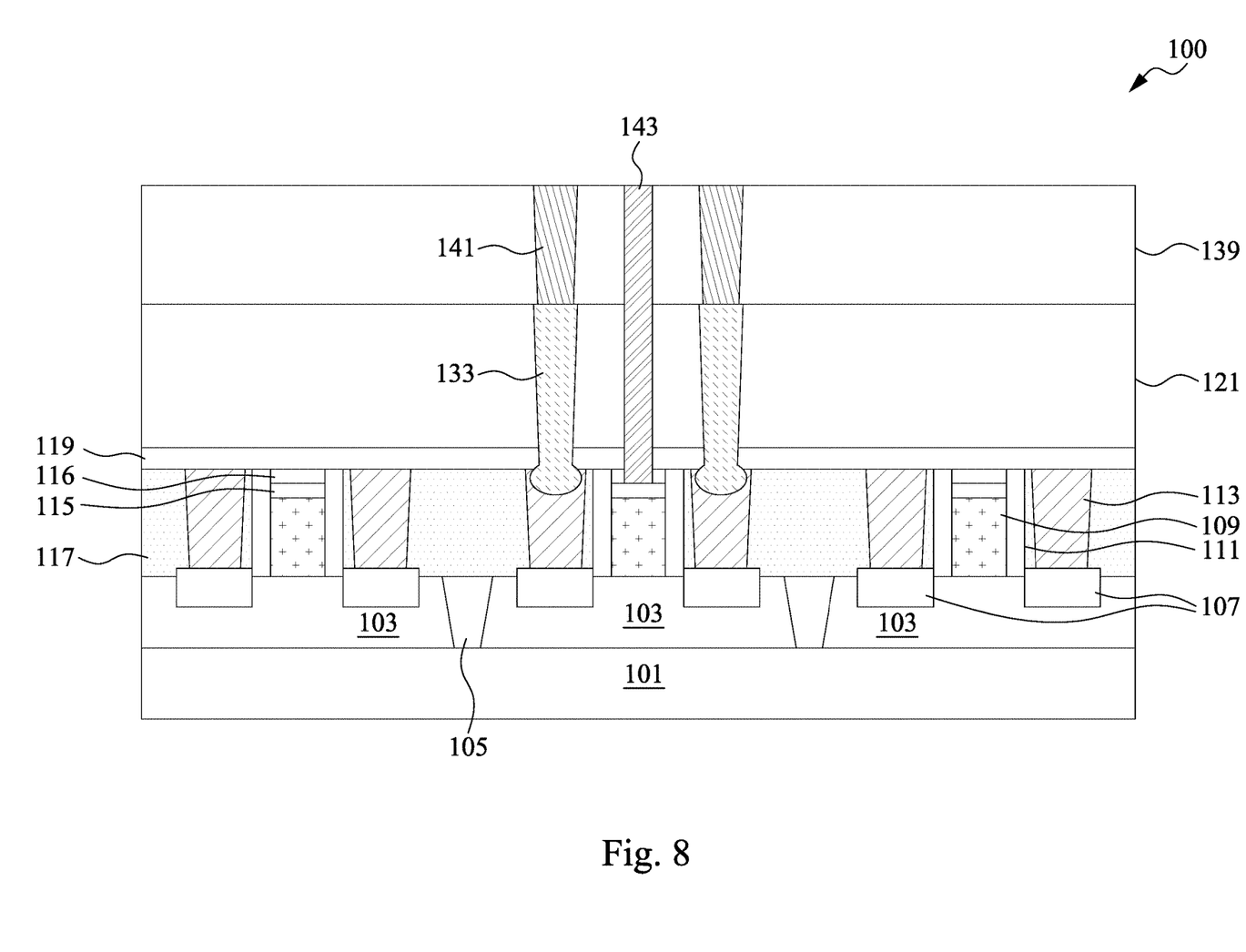

Next, in FIG. 8, a dielectric layer 139 is formed over the IMD layer 121. The dielectric layer 139 may be formed of a same or similar material as the IMD layer 121 by the same or similar formation method, thus details are not repeated. Next, vias 141 are formed in the dielectric layer 139 over and electrically couple to the underlying vias 133. The vias 141 may be formed by forming via openings in the dielectric layer 139 to expose the underlying vias 133, filling the via openings with a conductive material, and performing a CMP process after filling the via openings. In the illustrated embodiment, the vias 141 are formed of a same material (e.g., tungsten) as the vias 133. In the example of FIG. 8, the vias 141 do not have the enlarged bottom portions as the vias 133, because the slurry used for the CMP process has a high etch rate for the material (e.g., cobalt) of the contact plugs 113, but has a low etch rate for the material (e.g., tungsten) of the vias 133. In other embodiments, the vias 141 may be formed to have enlarged bottom portions same as or similar to the enlarged bottom portions of the vias 133.

Additional processing steps may follow the processing of FIG. 8 to complete the fabrication of the semiconductor device 100. For example, vias 143 may be formed over and electrically coupled to the gate structures 109. The vias 143 may be formed to extend through the IMD layer 121 and the dielectric layer 139 to be in contact (e.g., physical contact) with the cap layer 115 (e.g., tungsten) of the gate structures 109. Additional layers of dielectric layers may be formed over the dielectric layer 139, and conductive features (e.g., conductive lines and vias) may be formed in the additional layers of dielectric layers to form the interconnect structures of the semiconductor device 100, which interconnect structures electrically interconnect the underlying electrical components to form functional circuits. Details are not discussed here.

Variations to the disclosed embodiments are possible and are fully intended to be included within the scope of the present disclosure. For example, while the disclosed method is described in the context of forming a via over a source/drain contact plug, the spirit of the disclosure may be applied to form conductive features (e.g., vias) in other dielectric layers of the semiconductor device over other types of conductive features (e.g., conductive lines). As another example, besides the vias 133, other vias (e.g., 141) formed over the vias 133 may also be formed with enlarged bottom portions.

Embodiments may achieve advantages. The disclosed method form via openings with enlarged bottom portions, which allows vias (e.g., 133) with enlarged bottom portions to be formed. The enlarged bottom portions of the vias reduce the amount of CMP slurry that seeps down through cracks between the vias and the dielectric layer around the vias, thereby reducing the recessing of the conductive features (e.g., contact plugs 113) underlying the vias and improving the reliability of the electrical connection between the vias and the underlying conductive features. Additional advantage includes reduced electrical resistance for the vias and reduced RC delay for the device formed.

Figure 9:
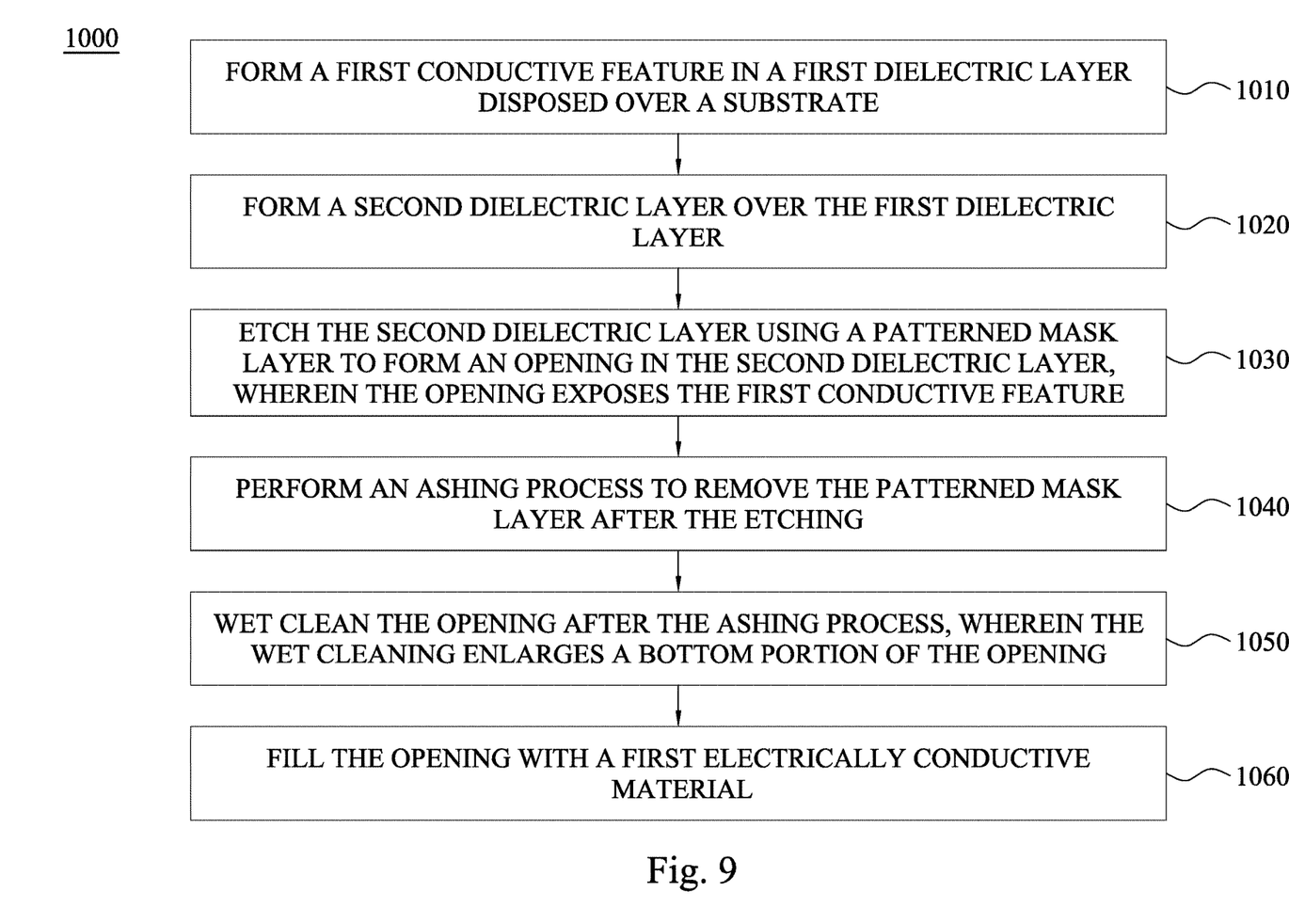
FIG. 9 illustrates a flow chart of a method of forming a semiconductor device, in accordance with some embodiments.

FIG. 9 illustrates a flow chart of a method of fabricating a semiconductor structure, in accordance with some embodiments. It should be understood that the embodiment method shown in FIG. 9 is merely an example of many possible embodiment methods. One of ordinary skill in the art would recognize many variations, alternatives, and modifications. For example, various steps as illustrated in FIG. 9 may be added, removed, replaced, rearranged, or repeated.

Referring to FIG. 9, at block 1010, a first conductive feature is formed in a first dielectric layer disposed over a substrate. At block 1020, a second dielectric layer is formed over the first dielectric layer. At block 1030, the second dielectric layer is etched using a patterned mask layer to form an opening in the second dielectric layer, wherein the opening exposes the first conductive feature. At block 1040, an ashing process is performed to remove the patterned mask layer after the etching. At block 1050, the opening is cleaned by a wet cleaning process after the ashing process, wherein the wet cleaning process enlarges a bottom portion of the opening. At block 1060, the opening is filled with a first electrically conductive material.

In accordance with an embodiment of the present disclosure, a method of forming a semiconductor device includes: forming a first conductive feature in a first dielectric layer disposed over a substrate; forming a second dielectric layer over the first dielectric layer; etching the second dielectric layer using a patterned mask layer to form an opening in the second dielectric layer, wherein the opening exposes the first conductive feature; performing an ashing process to remove the patterned mask layer after the etching; wet cleaning the opening after the ashing process, wherein the wet cleaning enlarges a bottom portion of the opening; and filling the opening with a first electrically conductive material. In an embodiment, the wet cleaning removes a top portion of the first conductive feature distal from the substrate and forms undercuts under the second dielectric layer. In an embodiment, after the wet cleaning, the bottom portion of the opening extends vertically into the first conductive feature and extends laterally beyond sidewalls of the second dielectric layer exposed by the opening. In an embodiment, etching the second dielectric layer comprises etching the second dielectric layer by performing a first plasma process, wherein performing the ashing process comprises performing a second plasma process different from the first plasma process. In an embodiment, the first plasma process is performed using a gas source comprising fluoride, wherein the second plasma process is performed using a gas source comprising hydrogen. In an embodiment, the fluoride is implanted in the first conductive feature by the first plasma process, wherein the method further comprises adjusting an RF power of the second plasma process, a process time of the second plasma process, or a pressure of the second plasma process in accordance with a concentration of fluoride in the first conductive feature. In an embodiment, the wet cleaning comprises: performing a first wet cleaning step using deionized water; performing a second wet cleaning step using an acid; and performing a third wet cleaning step using isopropyl alcohol. In an embodiment, the gas source of the first plasma process comprises $C_xH_yF_z$, and the gas source of the second plasma process comprises a mixture of $H_2$ and an inert gas, wherein the inert gas is Ar or He. In an embodiment, a mixing ratio between the inert gas and the $H_2$ in the gas source of the second plasma process is equal to or smaller than 2. In an embodiment, the method further includes, after filling the opening: forming a barrier layer over an upper surface of the second dielectric layer distal from the substrate; forming a second electrically conductive material over the barrier layer, wherein the first electrically conductive material and the second electrically conductive material comprise a same material but are formed using different formation methods; and performing a planarization process to remove the barrier layer and the second electrically conductive material. In an embodiment, the method further includes, after the planarization process: forming a third dielectric layer over the second dielectric layer; and forming a via in the third dielectric layer over and electrically coupled to the first electrically conductive material.

In accordance with an embodiment of the present disclosure, a method of forming a semiconductor device, the method includes: forming a first conductive feature in a first dielectric layer; forming a second dielectric layer over the first dielectric layer; forming an opening in the second dielectric layer to exposes an upper surface of the first conductive feature, wherein forming the opening comprises performing an anisotropic plasma etching process; after forming the opening, treating the first conductive feature with a plasma process different from the anisotropic plasma etching process; and after the plasma process, cleaning the opening using deionized water, wherein the cleaning enlarges a bottom portion of the opening. In an embodiment, the cleaning recesses an upper surface of the first conductive feature facing the second dielectric layer and forms undercuts under the second dielectric layer. In an embodiment, the method further includes filling the opening with an electrically conductive material after the cleaning, wherein the electrically conductive material fills the undercuts. In an embodiment, the anisotropic plasma etching process is performed using a first gas source comprising $C_xH_yF_z$, and wherein the plasma process is performed using a second gas source comprising a mixture of $H_2$ and Ar or a mixture of $H_2$ and He. In an embodiment, the first conductive feature is formed of cobalt.

In accordance with an embodiment of the present disclosure, a method of forming a semiconductor device includes: forming a first conductive feature in a first dielectric layer disposed over a substrate; forming a second dielectric layer over the first dielectric layer; etching the second dielectric layer to form an opening in the second dielectric layer, wherein the first conductive feature is exposed at a bottom of the opening; after the etching, treating the first conductive feature with a plasma process, wherein the plasma process converts an upper portion of the first conductive feature into a first material; after the plasma process, cleaning the opening by a wet cleaning process, wherein the wet cleaning process comprises a wet cleaning step using deionized water, wherein the deionized water removes the first material and enlarges the bottom of the opening; and after the cleaning, filling the opening with an electrically conductive material. In an embodiment, etching the second dielectric layer comprises performing a plasma etching process using an etching gas comprising fluoride, wherein the plasma process is performed using a gas source comprising hydrogen. In an embodiment, the enlarged bottom of the opening extends into the first conductive feature and includes undercuts under the second dielectric layer, wherein after filling the opening, the electrically conductive material fills the undercuts. In an embodiment, the first conductive feature is formed of cobalt, and the electrically conductive material is tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first conductive feature in a first dielectric layer disposed over a substrate;
    forming a second dielectric layer over the first dielectric layer;
    etching the second dielectric layer using a patterned mask layer to form an opening in the second dielectric layer, wherein the opening exposes the first conductive feature, wherein etching the second dielectric layer comprises etching the second dielectric layer by performing a first plasma process, wherein the first plasma process is performed using a gas source comprising fluoride;
    removing the patterned mask layer by performing an ashing process after the etching, wherein performing the ashing process comprises performing a second plasma process different from the first plasma process, wherein the second plasma process is performed using a gas source comprising hydrogen, wherein a first plasma of the first plasma process is different from a second plasma of the second plasma process;
    wet cleaning the opening after the ashing process, wherein the wet cleaning enlarges a bottom portion of the opening; and
    filling the enlarged opening with a first electrically conductive material.

2. The method of claim 1, wherein the wet cleaning removes a top portion of the first conductive feature distal from the substrate and forms an undercut under the second dielectric layer, wherein the undercut extends beyond a sidewall of the second dielectric layer exposed by the opening.

3. The method of claim 1, wherein after the wet cleaning, the bottom portion of the enlarged opening extends vertically into the first conductive feature and extends laterally beyond sidewalls of the second dielectric layer exposed by the enlarged opening.

4. The method of claim 1, wherein the fluoride is implanted in the first conductive feature by the first plasma process, wherein the method further comprises adjusting an RF power of the second plasma process, a process time of the second plasma process, or a pressure of the second plasma process in accordance with a concentration of fluoride in the first conductive feature.

5. The method of claim 1, wherein the second plasma process converts a top portion of the first conductive feature distal from the substrate into a water-soluble material, wherein the wet cleaning comprises:
    performing a first wet cleaning step using deionized water alone;
    performing a second wet cleaning step using an acid; and
    performing a third wet cleaning step using isopropyl alcohol.

6. The method of claim 1, wherein the gas source of the first plasma process comprises $C_xH_yF_z$, and the gas source of the second plasma process comprises a mixture of $H_2$ and an inert gas, wherein the inert gas is Ar or He.

7. The method of claim 6, wherein a mixing ratio between the inert gas and the $H_2$ in the gas source of the second plasma process is equal to or smaller than 2.

8. The method of claim 1, further comprising, after filling the enlarged opening:
    forming a barrier layer over an upper surface of the second dielectric layer distal from the substrate;
    forming a second electrically conductive material over the barrier layer, wherein the first electrically conductive material and the second electrically conductive material comprise a same material but are formed using different deposition methods; and
    performing a planarization process, wherein the planarization process removes the barrier layer and the second electrically conductive material completely and exposes the upper surface of the second dielectric layer.

9. The method of claim 8, further comprising, after the planarization process:
    forming a third dielectric layer over the second dielectric layer; and
    forming a via in the third dielectric layer over and electrically coupled to the first electrically conductive material.

10. The method of claim 4, wherein the semiconductor device is formed on a wafer, wherein the method further comprises determining the concentration of fluoride in the first conductive feature by:
    etching a test wafer by performing the first plasma process using the gas source comprising fluoride, wherein the test wafer is a different wafer from the wafer comprising the semiconductor device, wherein the test wafer comprises a second conductive feature in a third dielectric layer and comprises a fourth dielectric layer over the third dielectric layer, wherein the second conductive feature and the first conductive feature comprise a same material, wherein etching the test wafer forms another opening in the fourth dielectric layer and exposes the second conductive feature; and after etching the test wafer, measuring a concentration of fluoride in the second conductive feature and using the measured concentration of the fluoride in the second conducive feature as an estimate of the concentration of fluoride in the first conductive feature.

11. The method of claim 8, wherein filling the enlarged opening with the first electrically conductive material forms a first via on the first conductive feature, with an upper portion of the first via protruding above the upper surface of the second dielectric layer, wherein after forming the barrier layer and before forming the second electrically conductive material, the barrier layer contacts and extends along sidewalls of the upper portion of the first via, wherein after forming the second electrically conductive material and before performing the planarization process, the second electrically conductive material contacts and extends along an upper surface of the barrier layer distal from the substrate, and along an upper surface of the first via distal from the substrate.

12. A method of forming a semiconductor device, the method comprising:
forming a first conductive feature in a first dielectric layer disposed over a substrate;
forming a second dielectric layer over the first dielectric layer;
etching the second dielectric layer using a patterned mask layer to form an opening in the second dielectric layer, wherein the opening exposes the first conductive feature, wherein etching the second dielectric layer comprises etching the second dielectric layer by performing a first plasma process, wherein the first plasma process is an anisotropic etching process performed using a gas source comprising fluoride;
removing the patterned mask layer by performing an ashing process after the etching, wherein performing the ashing process comprises performing a second plasma process different from the first plasma process, wherein the second plasma process is performed using a gas source comprising hydrogen, wherein a second plasma used in the second plasma process is different from a first plasma used in the first plasma process;
wet cleaning the opening after the ashing process, wherein the wet cleaning enlarges a bottom portion of the opening; and
filling the enlarged opening with a first electrically conductive material.

13. The method of claim 12, wherein the first conductive feature is formed of cobalt, wherein the gas source of the first plasma process comprises $C_xH_yF_z$, and wherein the gas source of the second plasma process comprises a mixture of $H_2$ and an inert gas.

14. The method of claim 13, wherein a mixing ratio between the inert gas and the $H_2$ in the gas source of the second plasma process is equal to or smaller than 2.

15. The method of claim 12, further comprising, after filling the enlarged opening:
forming a barrier layer over the second dielectric layer, wherein the barrier layer contacts and extends along an upper surface of the second dielectric layer distal from the substrate;
forming a second electrically conductive material over the barrier layer, wherein the second electrically conductive material contacts and extends along an upper surface of the barrier layer distal from the substrate, wherein the first electrically conductive material and the second electrically conductive material comprise a same material but are formed using different deposition methods; and
performing a planarization process, wherein the planarization process completely removes the barrier layer and the second electrically conductive material, and exposes the upper surface of the second dielectric layer.

16. A method of forming a semiconductor device, the method comprising:
forming a first conductive feature in a first dielectric layer, wherein the first dielectric layer is disposed over a substrate, wherein the first conductive feature is formed of cobalt;
forming a second dielectric layer over the first dielectric layer;
etching the second dielectric layer using a patterned mask layer to form an opening in the second dielectric layer, wherein the opening exposes the first conductive feature, wherein etching the second dielectric layer comprises etching the second dielectric layer by performing a first plasma process, wherein the first plasma process is a single etching process performed using a gas source comprising fluoride;
removing the patterned mask layer by performing an ashing process after the etching, wherein performing the ashing process comprises performing a second plasma process different from the first plasma process, wherein the second plasma process is another single etching process performed using a gas source comprising hydrogen, wherein a first plasma used in the first plasma process is different from a second plasma used in the second plasma process;
wet cleaning the opening after the ashing process, wherein the wet cleaning enlarges a bottom portion of the opening; and
filling the enlarged opening with a first electrically conductive material.

17. The method of claim 16, wherein the gas source of the first plasma process comprises $C_xH_yF_z$, and wherein the gas source of the second plasma process comprises a mixture of $H_2$ and an inert gas, wherein a mixing ratio between the inert gas and the $H_2$ in the gas source of the second plasma process is equal to or smaller than 2.

18. The method of claim 16, wherein filling the enlarged opening with the first electrically conductive material forms a first via, wherein the method further comprises, after filling the enlarged opening:
forming a barrier layer over an upper surface of the second dielectric layer distal from the substrate;
forming a second electrically conductive material over an upper surface of the barrier layer distal from the substrate, wherein the first electrically conductive material and the second electrically conductive material comprise a same material but are formed using different deposition methods;
performing a planarization process after forming the second electrically conductive material, wherein the planarization process completely removes the barrier layer and the second electrically conductive material, and exposes the upper surface of the second dielectric layer;
after performing the planarization process, forming a third dielectric layer over the upper surface of the second dielectric layer; and
forming a second via in the third dielectric layer, wherein the second via is over and electrically coupled to the first via.

19. The method of claim 18, wherein the second via is formed of a third electrically conductive material different from the first electrically conductive material of the first via.

20. The method of claim 17, wherein the inert gas is argon gas or helium gas.

* * * * *